United States Patent
Malozemoff et al.

(10) Patent No.: US 6,436,317 B1
(45) Date of Patent: Aug. 20, 2002

(54) OXIDE BRONZE COMPOSITIONS AND TEXTURED ARTICLES MANUFACTURED IN ACCORDANCE THEREWITH

(75) Inventors: Alexis P. Malozemoff, Lexington; Alexander Otto, Chelmsford; Cornelis Leo Hans Thieme, Westborough; Martin W. Rupich, Framingham, all of MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/579,193

(22) Filed: May 26, 2000

Related U.S. Application Data
(60) Provisional application No. 60/136,488, filed on May 28, 1999.

(51) Int. Cl.[7] .................................................. H01B 1/02
(52) U.S. Cl. .................... 252/519.1; 505/230; 505/231; 505/238; 505/701; 505/704; 252/520.5; 174/125.1
(58) Field of Search .......................... 252/519.1, 520.5; 505/230, 231, 238, 701, 704; 174/125.1; 148/96

(56) References Cited

U.S. PATENT DOCUMENTS

| | | | |
|---|---|---|---|
| 3,985,281 A | 10/1976 | Diepers et al. | 228/148 |
| 4,994,433 A | 2/1991 | Chiang | 505/1 |
| 5,038,127 A | 8/1991 | Dersch | 335/216 |
| 5,071,828 A | 12/1991 | Greuter et al. | 505/1 |
| 5,073,537 A | 12/1991 | Hung et al. | 505/1 |
| 5,231,074 A | 7/1993 | Cima et al. | 505/1 |
| 5,449,659 A | 9/1995 | Garrison et al. | 505/330 |
| 5,741,377 A | 4/1998 | Goyal et al. | 148/512 |
| 5,866,252 A | 2/1999 | de Rochemont et al. | 428/373 |
| 5,968,877 A | 10/1999 | Budai et al. | 505/237 |
| 6,027,564 A | 2/2000 | Fritzemeier et al. | |

FOREIGN PATENT DOCUMENTS

| | | |
|---|---|---|
| EP | 0 308 869 A2 | 3/1989 |
| EP | 0 387 525 A1 | 9/1990 |
| EP | 0 431 782 A1 | 6/1991 |
| EP | 506582 | 9/1992 |
| EP | 0 584 410 A1 | 3/1994 |
| EP | 0 872 579 A1 | 10/1998 |
| WO | WO 92/05591 | 4/1992 |
| WO | WO 97/05669 | 2/1997 |
| WO | WO 98/58415 | 12/1998 |
| WO | WO 99/16941 | 4/1999 |
| WO | WO 99/17307 | 4/1999 |
| WO | WO 99/25908 | 5/1999 |
| WO | WO 99/35083 | 7/1999 |

OTHER PUBLICATIONS

Sato et al "Evidence of Structural phase Transitions in superconducting rubidium tungstate (RbxWO3)", Phys. Rev. B: Condens Matter (1982), 25(1), 501–3. Abstract Only.*

(List continued on next page.)

*Primary Examiner*—Mark Kopec
(74) *Attorney, Agent, or Firm*—Fish & Richardson, P.C.

(57) ABSTRACT

Oxide bronze compositions and articles manufactured in accordance therewith are provided. The oxide bronze compositions have the general formula $A_xBO_y$, in which A comprises an alkali, alkaline earth or rare earth metal and in which A has a valence, m, equal to 1, 2 or 3, B comprises a transition metal having a valence, n, less than or equal to 6, $0<x<1$ on an atomic ratio basis and $y=[(x)(m)+n]/2$. High temperature superconducting devices incorporating such compositions are also provided. The superconducting devices include a substrate having a polycrystalline superconducting layer or filament deposited on top of or embedded in the substrate. The superconducting layer or filament is formed of the oxide bronze composition. In some embodiments, the oxide bronze layer is textured with a full-width-half-maximum of a pole figure of less than or equal to 20 degrees.

37 Claims, 3 Drawing Sheets

OTHER PUBLICATIONS

Skokan et al "Normal and Superconducting properties of Tungsten Bronze (CsxWO3)", Phys. Rev. B: Condens. Matter (1979), 20(9), 3670–7. Abstract Only.*

Schmidbauer et al "Electrical transport properties of mono– and polycrystalline iron tungstate (FeWO4)", J. Phys.: Condens. Matter (1991), 3(28), 5341–52. Abstract Only.*

Mahanty et al "Preparation and Optical studies of Polycrystalline bismuth tungsten oxide (Bi2WO6)", Mater. Lett. (1991), 11(8–9), 254–6. Abstract Only.*

U.S. patent application Ser. No. 09/617,520, Lu et al., filed Jul. 14, 2000.

U.S. patent application Ser. No. 09/616,570, Fritzemeier et al., filed Jul. 14, 2000.

U.S. patent application Ser. No. 09/500,717, Fritzemeier et al., filed Feb. 9, 2000.

U.S. patent application Ser. No. 09/500,718, Malozemoff et al., filed Feb. 9, 2000.

U.S. patent application Ser. No. 09/616,566, Zhang et al., filed Jul. 14 2000.

U.S. patent application Ser. No. 09/615,669, Buczek et al., filed Jul. 14, 2000.

U.S. patent application Ser. No. 09/617,518, Fritzemeier, filed Jul. 14, 2000.

U.S. patent application Ser. No. 09/500,701, Buczek et al., filed Feb. 9, 2000.

Apicella et al., "The Effects of Surface Contamination On The Biaxially Textured Substrate For YBCO Thick Film Deposition", International Journal of Modern Physics B, vol. 13, Nos. 8 & 10 (1999) pp 997–1004.

He et al., "Deposition of biaxilaly–oriented metal and oxide buffer–layer films on textured Ni tapes: new substrates for high–current, high–temperature superconductors", Physica C, 275 (1997) 155–161.

McIntyre et al, "Epitaxial nucleation and growth of chemically derived $Ba_2Ycu_3O_{7-x}$ thin films on (001) $SrTiO_3$", Journal of Applied Physics, 77 May 15, 1995, No. 10, pp 5263–5272.

Boffa et al., "Laser–ablation deposition of $CeO_2$ thin films on biaxially textured nickel substrates", Physica C 312 (1999) 202–212.

He et al., "Growth of biaxially oriented conductive $LaNiO_3$ buffer layers on textured Ni tapes for high–Tc–coated conductors", Physica C 314 (1999) 105–111.

Sheth et al., "Bench Scale Evaluation of Batch Mode Dip–Coating of Sol–Gel $LaAIO_3$ Buffer Material", IEEE Transactions on Applied Superconductivity, vol. 9, No. 2, Jun. 1999, pp 1514–1518.

Smith et al., "High Critical Current Density Thick MOD–Derived YBCO Films", IEEE Transactions on Applied Superconductivity, vol. 9, No. 2, Jun. 1999, pp 1531–1534.

Beach et al., "Sol–Gel Synthesis of Rare Earth Aluminate Films as Buffer Layers for High Tc Superconducting Films", Mat. Res. Soc. Symp. Proc. vol. 495, 195, pp 263–270.

Lee et al., "Alternative Buffer Architectures for High Critical Current Density YBCO Superconducting Deposits on Rolling Assisted Biaxially–Textured Substrates", Jpn. J. Appl. Phys. vol. 38 (1999) Pt. 2, No. 2B, pp 178–180.

Paranthaman et al., Growth of biaxially textured $RE_2O_3$ buffer layers on rolled–Ni substrates using reactive evaporation for HTS–coated conductors, Supercond. Sci. Techno. 12(1999) 319–315. Printed in UK.

Rupich et al., "Growth and Characterization of Oxide Buffer Layers for YBCO Coated Conductors", IEEE Transactions on Applied Superconductivity, vol. 9, No. 2, Jun. 1999, pp 1527–1530.

Shoup et al., "Epitaxial Thin Film Growth of Lanthanum and Neodymium Aluminate Films on Roll–Textured Nickel Using a Sol–Gel Method", Journal of the American Ceramic Society, vol. 81, No. 11, Nov. 1998, pp–3019–3021.

"Dry Etching for VLSI Fabrication", vol. 1, eds. S. Wolf and R.N. Tamber, Lattice Press, Sunset Park, CA, pp 539–574 (1986).

Tanaka et al., "Improvement of $YBa_2Cu_3O_x$ Single–Crystal Surface by Chemical Etching", Jpn. J. App. Phys. vol. 38 (1999) pp L731–L733, Part 2, No. 7A, Jul. 1, 1999.

Koster et al., "flInfluence of the surface treatment on the homoepitaxial growth of $SrTiO_3$", Materials Science and Engineering B56 (1998) 209–212.

McIntyre et al., "Effect of growth conditions on the properties and morphology of chemically derived eiptaxial thin films of $Ba_2Ycu_3O_{7-x}$ on (001) $LaAIO_3$", J. Appl. Phys. 71 (4), Feb. 15, 1992, pp 1868–1877.

"Fabrication of High Temperature Superconducting Films Using Perfluoro–Organometallic Precursors", IMB Technical Disclosure Bulletin, vol. 32, No. 5B, Oct. 1989, p 241.

* cited by examiner

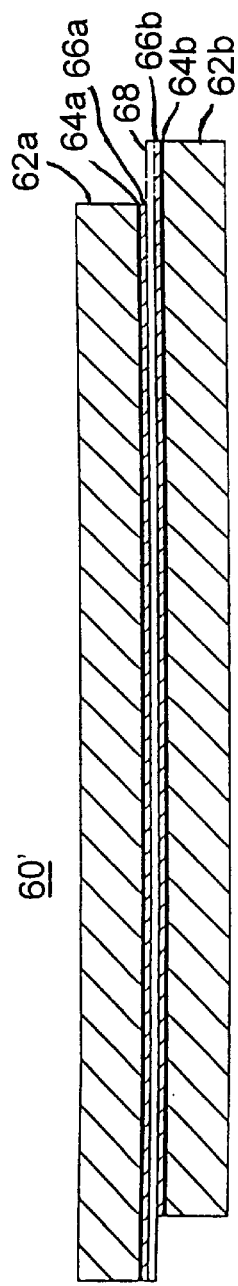
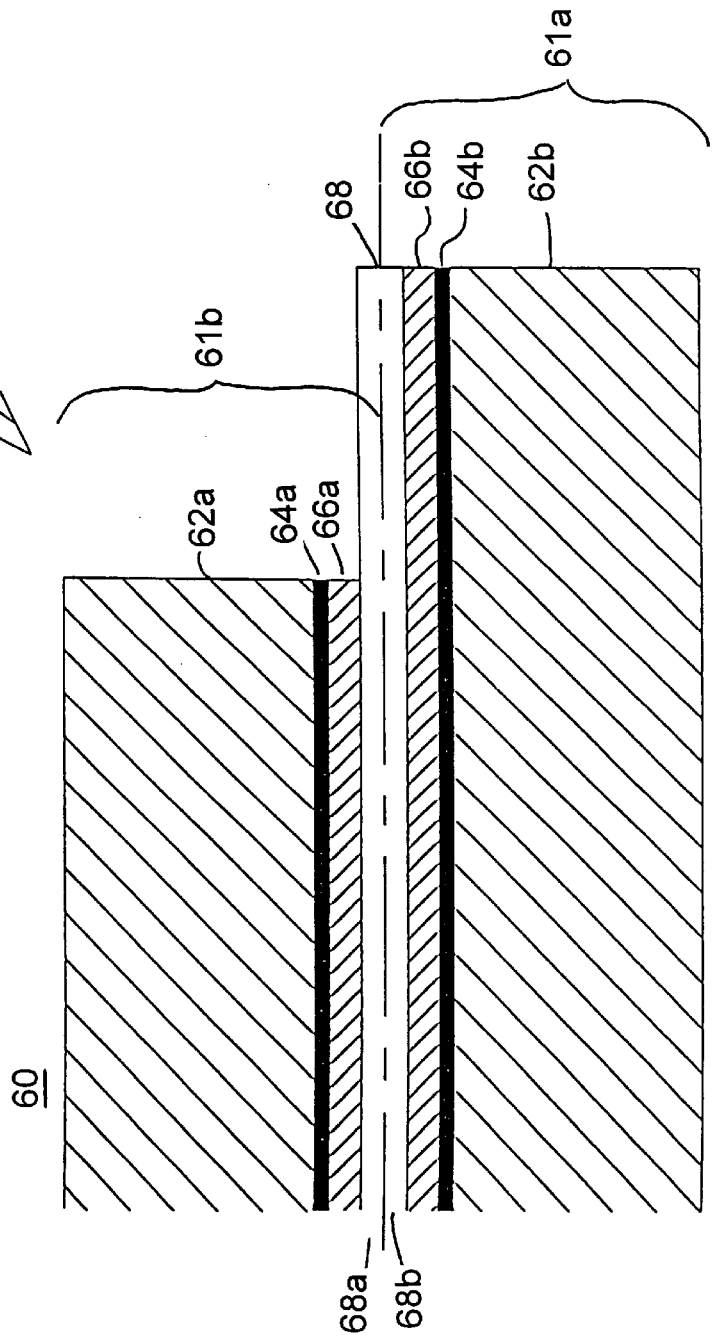

OXIDE BRONZE COMPOSITIONS AND TEXTURED ARTICLES MANUFACTURED IN ACCORDANCE THEREWITH

This application claims the benefit of U.S. provisional application No. 60/136,488, filed May 28, 1999.

TECHNICAL FIELD

The present invention generally relates to oxide bronze compositions. The invention more particularly relates to methods of making oxide bronze compositions and articles formed in accordance therewith.

BACKGROUND OF THE INVENTION

Oxide bronzes, as described in A. F. Wells, *Structural Inorganic Chemistry*, $5^{th}$ ed., pp. 612–625 (copyright Oxford University Press 1974, 1984), incorporated herein by reference, typically include solid oxide phases of transition metals such as tungsten, molybdenum, niobium, rhenium, titanium, vanadium, or the like that are doped with cations from the alkali, alkaline earth or lanthanide group elements. The oxide bronzes are characterized by intense color, metallic conductivity or semiconductivity and resistance to attack by non-oxidizing acids. As discussed herein, the terminology "oxide bronze" is used in accordance with the present invention to refer to this subgroup of solid oxide phases, distinguishing them from other transition metal oxides and from the purely metallic copper-based alloys called simply "bronze."

Oxide bronzes have been extensively studied, and properties of interest for applications have been found. For example, superconductivity has been found in certain compositions at very low temperatures (i.e. helium boiling point range, approximately 4.2 K). More recently, an observation has been made as to the possibility of superconductivity in sodium tungsten bronze phase formed near the surface of a $WO_3$ crystal ("$Na_{0.05}WO_3$," *High-Tc Update*, Vol. 13, No. 9, p.1 May 1, 1999; Reich et al., "Possible Nucleation of a 2D Superconducting Phase on $WO_3$ Single Crystals Surface Doped With $Na^+$" *The European Physical Journal B*, vol. 9, 1–4; both of which are incorporated herein by reference). This suggestion specifically relates to the observation of possible superconducting characteristics and a superconducting transition temperature ($T_c$) of approximately 91 K in Na-doped $WO_3$ crystals having a surface composition of $Na_{0.05} WO_3$. The possible superconductivity is suggested to occur near the surface of the sodium-doped crystal. Other properties of the oxide bronzes of interest for applications include dielectric, piezoelectric and electro-chromic properties.

For applications requiring large volumes or areas of material, single crystals are usually not practical, and some kind of polycrystalline structure is required. In addition, oxide bronzes in which the grains are not textured or aligned to reduce or eliminate weak link couplings between grains can pose significant limitations on the fabrication and practical use of certain devices formed of such materials. For example, for long-length polycrystalline superconducting wires, it can be essential to avoid weak link couplings between grains which limit supercurrent density.

In the class of high temperature superconductor (HTS) cuprates (all of which are not in the class of oxide bronzes), various techniques for polycrystalline texturing are utilized. It is generally sufficient, for example, in the case of the BSCCO-based HTS materials to align the grains such that only the c-axis is aligned in the same direction (uniaxial alignment). It is generally not necessary that the a-b planes be aligned. The required c-axis texture in the BSCCO materials can be obtained utilizing various deformation processes, e.g. a thermal-mechanical deformation process.

In the YBCO HTS systems, it is typically necessary to align the grains in the a-, b-, and c-axis directions (biaxial alignment), but the [100] direction must be aligned in the current direction. This can be accomplished for example by growing the YBCO grains on a textured template structure that has a unique crystallographic orientation called "cube texture". The texture requirement in this case has been shown to lie within 10 and preferably 5 degrees of misorientation angle between grains, if no significant diminution of current carrying capacity is to occur. The oxide bronzes may also need to be biaxially aligned for the highest current carrying capacity. In contrast to the YBCO systems, however, the oxide bronzes can have many other textures besides cube texture.

In the context of high temperature superconductor (HTS) applications, it would therefore be desirable to provide polycrystalline structures that are advantageous over the prior art. In particular, fine-grained materials would be desirable for excellent homogeneity if grain boundary weak links are not an obstacle. It would also be desirable to provide oxide bronze superconducting compositions having grains sufficiently textured or aligned as to overcome weak link characteristics of the grain boundaries, thereby allowing transport of high current across such grain boundaries. Other properties of oxide bronze compositions may also be optimized by providing textured polycrystalline or granular structures. For example, the dielectric breakdown field of oxide bronze capacitors may be increased by texturing.

SUMMARY OF THE INVENTION

The present invention provides methods for making oxide bronze compositions and articles incorporating such compositions. More specifically, the present invention describes procedures for the synthesis of oxide bronzes into forms that can be useful for the fabrication of practical devices.

As used herein, "oxide bronze" in accordance with the present invention include materials having the general formula $A_xBO_y$, in which A is an alkali metal (e.g., Li, Na, K, Rb or Cs), an alkaline-earth metal (e.g. Mg, Ca, Sr or Ba), a lanthanide metal (e.g. La, Ce, Pr, Nd, Pm, Sm, Eu, Gd, Tb, Dy, Ho, Er, Tm, Yb or Lu) or one of: In, Cu, Sn, Pb, Tl or Ag and in which A has a valence, m, of 1, 2 or 3; B is a transition metal (e.g. Ti, V, Nb, Ta, Mo, W, Re or Ru) and has a valence, n, of less than or equal to 6; $0<x<1$; and $y=[(x)(m)+n]/2$. In some embodiments, $0.001<x<0.3$ and $2.8<y<3.05$.

In some embodiments, the oxide bronzes are based on a host structure having a composition of $BO_2$ or $BO_3$, with the valence, n, of B being respectively less than or equal to 4 or 6. The cation $A^m$ (where m is the valence of A and is typically 1, 2 or 3) can be incorporated into the $BO_2$ or $BO_3$ structure if a portion, (x)(m), of the $B^n$ atoms in $BO_y$ are reduced to $B^{n-1}$. The electrical properties of the oxide bronzes are associated with the fact that no distinction can be made between the $B^n$ and $B^{n-1}$ atoms in the lattice. The extra electrons, (x)(m), per mole are delocalized over the lattice.

The present invention thus relates to unique oxide bronze compositions and structures and methods of making such structures. Mere preparation of oxide-based bronzes (e.g., $Na_xWO_3$) in bulk form, however, is not sufficient to render them useful for the applications described herein. In order to produce useful articles and devices, the present invention therefore provides, in one aspect, polycrystalline oxide bronze structures having very small, fine grains (e.g., typically in the micron or submicron range in their maximum dimension), which can be for example, rod-like, or equi-axed. Small grains provide the polycrystalline material with mechanical robustness, and improved sintering and density characteristics. In the case of oxide superconductors in which the current capacity within each grain (crystal) varies systematically within the grain relative to position or direction, fine grains tend to reduce the maximum length scale of inhomogeneity, providing for a macroscopically more homogeneous superconductor with improved properties. Grains of larger dimensions (i.e., a few hundred μm) can also be satisfactory for some utilities of the present invention. In coated conductors, single crystal may be the most suitable form, and small grain sizes may not be favorable. Therefore, in some embodiments, the polycrystalline superconducting layer is a thin continuous sheet disposed on the substrate, in which the average grain size is epitaxially related to the grain size of the underlying substrate. In other embodiments, the polycrystalline superconducting layer is a filament embedded in a matrix and comprises small, fine grains in at least one direction. In general, there is no restriction on grain size; both large (>10 micron) and small (<10 micron) grain sizes can be suitable for varying applications. The grain size can be primarily dictated by the grain size of the substrate and when based on roll-textured metals, is typically greater than 10 microns. The epitaxially grown oxide bronze superconductor generally adopts the grain size of the substrate.

Another aspect of polycrystalline oxide bronze structures addressed by the present invention includes structures in which the grains are strongly textured. Texture can be characterized by an x-ray rocking curve or pole figure in which the full-width-half-maximum (FWHM) preferably is less than or equal to 20 degrees wide (and more preferably less than or equal to 10 degrees). Highly textured structures can provide a variety of advantages. In long-length polycrystalline superconducting wires for example, it can be essential to avoid weak-link couplings between grains which limit the current density. In addition to allowing transport of high current across grain boundaries, other properties of oxide bronze compositions may be optimized by providing textured polycrystalline or granular structures. For example, the dielectric breakdown field of oxide bronze capacitors may be increased by texturing.

Structures in which weak-link coupling is avoided and in which fine grain sizes are provided can be achieved simultaneously in certain cases to provide articles and devices having even more favorable properties.

In preferred embodiments, the compositions and textured articles formed utilizing such compositions are suitable for use as superconducting devices. For example and while not to be construed as limiting, oxide bronze textured articles formed in accordance with the present invention include superconducting products such as power transmission cables, motors, generators, transformers, fault current limiters, magnets, electronic applications and the like. Exemplary applications in the electronics area include, bit are not limited to, passive communications applications such as antennae, wave guides, filters and interconnects, and data processing or analog applications based on active devices such as Josephson junctions and superconducting field effect transistors. It is anticipated that when these articles are formed in accordance with the invention, high temperature superconducting devices that exhibit high superconducting transition temperature $T_c$ (e.g., greater than 50 K) and high critical current densities will be provided. In preferred embodiments, the $T_c$ will be greater than 77 K and in particularly preferred embodiments, the $T_c$ will be significantly greater than 77 K (e.g. 90 K and above). Critical current densities are expected to be greater than 100 kA/cm$^2$ at $T_c/2$. These materials may have a perovskite-like structure, often with a cubic, hexagonal or tetragonal unit cell. Even in cases of lower symmetry, however, it is expected that the inherent electrical and magnetic properties of the grains in these materials will be significantly more isotropic than the high temperature superconducting materials based on the cuprates. In cases where the texturing methods of this invention are utilized, the inherent bulk properties are expected to be much more isotropic relative to HTS cuprates and to provide desirable superconducting properties. An aspect of this invention is the recognition that the grains can be relatively equi-axed in shape, affording more nearest neighbor contacting grains than in the anisotropic superconductors. This, in combination with isotropic current transport, allows for higher current capacity in a bulk article with a lower degree of texturing than in cuprate-based HTS oxides. In one embodiment of the present invention, methods for fabricating the oxide bronze superconductors into textured structures which are useful in practical applications (particularly in the form of long-length flexible wires) are provided.

In addition, it is anticipated that other properties (e.g. dielectric, piezoelectric and electrochromic properties) of the oxide bronze compositions and articles of the present invention may be useful for fabrication of practical non-superconducting devices. For example, optical applications in which a textured article may provide an advantage include electrochromic devices. In addition, ferroelectric devices such as capacitors and piezoelectrics may be desirable to texture in accordance with the present invention. In one aspect of the invention, textured articles including the non-stoichiometric compound $Na_xWO_y$ and exhibiting various magnetic, electrical, and optical characteristics are provided. In these embodiments, it x may be 0.001<x<0.3.

The foregoing has outlined some of the more pertinent aspects of the present invention. These aspects should be construed to be merely illustrative of some of the more prominent features and applications of the invention. Many other beneficial results can be attained by applying the disclosed invention in a different manner or modifying the invention as will be described. Accordingly, other objects and a fuller understanding of the invention may be had by referring to the following Detailed Description of the Preferred Embodiments.

BRIEF DESCRIPTION OF THE DRAWINGS

For a fuller understanding of the present invention, reference is had to the following description taken in conjunction with the accompanying drawings, in which:

FIG. 6A is an illustration of a construction architecture for a coated conductor article according to a particular embodiment of the present invention.

FIG. 6B is an expanded view of the overlapped region of FIG. 6A.

Similar reference characters refer to similar parts throughout the several views of the drawings.

DETAILED DESCRIPTION OF THE PREFERRED EMBODIMENTS

Figure 1:
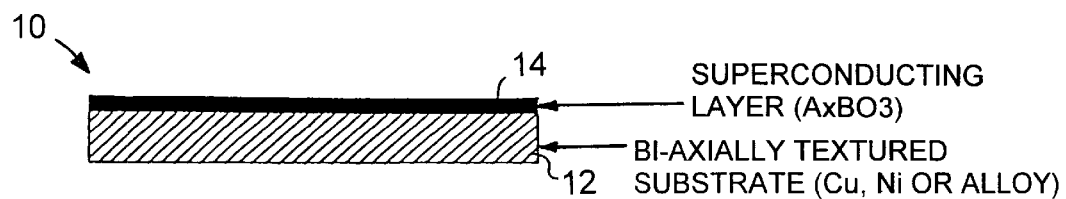
FIG. 1 is an illustration of an oxide bronze article in accordance with the present invention.

The present invention provides methods for making oxide bronze compositions and articles incorporating such compositions. More specifically, the present invention describes procedures for the synthesis of oxide bronzes into forms that can be useful for the fabrication of practical devices.

As used herein, "oxide bronze" in accordance with the present invention include materials having the general formula $A_xB_y$, in which A is an alkali metal (e.g., Li, Na, K, Rb or Cs), an alkaline-earth metal (e.g. Mg, Ca, Sr or Ba), a lanthanide metal (e.g. La, Ce, Pr, Nd, Pm, Sm, Eu, Gd, Tb, Dy, Ho, Er, Tm, Yb or Lu) or one of: In, Cu, Sn, Pb, Tl or Ag and in which A has a valence, m, of 1, 2 or 3; B is a transition metal (e.g. Ti, V, Nb, Ta, Mo, W, Re or Ru) and has a valence, n, of less than or equal to 6; $0<x<1$; and $y=[(x)(m)+n]/2$. In some embodiments, $0.001<x<0.3$ and $2.8<y<3.05$. In some embodiments, the superconductor can be doped (e.g. with carbon or platinum) to improve its superconducting properties.

In some embodiments, the oxide bronzes are based on a host structure having a composition of $BO_2$ or $BO_3$, with the valence, n, of B being respectively less than or equal to 4 or 6. The cation $A^m$ (where m is the valence of A and is typically 1, 2 or 3) can be incorporated into the $BO_2$ or $BO_3$ structure if a portion, (x)(m), of the $B^n$ atoms in $BO_y$ are reduced to $B^{n-1}$. The electrical properties of the oxide bronzes are associated with the fact that no distinction can be made between the $B^n$ and $B^{n-1}$ atoms in the lattice. The extra electrons, (x)(m), per mole are delocalized over the lattice. See, A. F. Wells, *Structural Inorganic Chemistry*, $5^{th}$ ed., pp. 612–625 (copyright Oxford University Press 1974, 1984), incorporated herein by reference.

The present invention thus relates to unique oxide bronze compositions and structures and methods of making such structures. Mere preparation of oxide-based bronzes (e.g., $Nx_xWO_3$) in bulk form, however, is not sufficient to render them useful for the applications described herein. In order to produce useful articles and devices, the present invention therefore provides, in one aspect, polycrystalline oxide bronze structures having very small grains (e.g., typically in the micron or submicron range in their maximum dimension). Small grains provide the polycrystalline material with mechanical robustness, and improved sintering and density characteristics. In the case of oxide superconductors in which the current capacity within each grain (crystal) varies systematically within the grain relative to position or direction, fine grains tend to reduce the maximum length scale of inhomogeneity, providing for a macroscopically more homogeneous superconductor with improved properties. In some embodiments, the superconducting properties can be enhanced by exposing the article to mositure or an $OH^-$ rich environment.

Another aspect of polycrystalline oxide bronze structures addressed by the present invention includes structures in which the grains are strongly textured. Texture can be characterized by an x-ray rocking curve or pole figure in which the full-width-half-maximum (FWHM) preferably is less than or equal to 20 degrees wide (and more preferably less than or equal to 10 degrees). Highly textured structures can provide a variety of advantages. In long-length polycrystalline superconducting wires for example, it can be essential to avoid weak-link couplings between grains which limit supercurrent density. In addition to allowing transport of high current across grain boundaries, other properties of oxide bronze compositions may be optimized by providing textured polycrystalline or granular structures. For example, the dielectric breakdown field of oxide bronze capacitors may be increased by texturing.

Structures in which weak-link coupling is avoided and in which fine grain sizes are provided can be achieved simultaneously in certain cases to provide articles and devices having even more favorable properties.

In preferred embodiments, the compositions and textured articles formed utilizing such compositions are suitable for use as superconducting devices. For example and while not to be construed as limiting, oxide bronze textured articles formed in accordance with the present invention include superconducting products such as power transmission cables, motors, generators, transformers, fault current limiters, magnets, electronic applications and the like. Exemplary applications in the electronics area include, but are not limited to, passive communications applications such as antennae, wave guides, filters and interconnects, and data processing or analog applications based on active devices such as Josephson junctions and superconducting field effect transistors. It is anticipated that when these articles are formed in accordance with the invention, high temperature superconducting devices that exhibit high superconducting transition temperature $T_c$ (e.g., greater than 50 K) and high critical current densities will be provided. In preferred embodiments, the $T_c$ will be greater than 77 K and in particularly preferred embodiments, the $T_c$ will be significantly greater than 77 K (e.g. 90 K and above). Critical current densities are expected to be greater than 100 $kA/cm^2$ at $T_c/2$. These materials may have a perovskite-like structure, often with a cubic, hexagonal or tetragonal unit cell. Even in cases of lower symmetry, however, it is expected that the inherent electrical and magnetic properties of the grains in these materials will be significantly more isotropic than the high temperature superconducting materials based on the cuprates. In cases where the texturing methods of this invention are utilized, the inherent bulk properties are expected to be much more isotropic relative to HTS cuprates and to provide desirable superconducting properties. An aspect of this invention is the recognition that the grains can be relatively equi-axed in shape, affording more nearest neighbor contacting grains than in the anisotropic materials. This, in combination with isotropic current transport, allows for higher current capacity in a bulk article with a lower degree of texturing than in cuprate-based HTS oxides. In one embodiment of the present invention, methods for fabricating the oxide bronze superconductors into textured structures which are useful in practical applications (particularly in the form of long-length flexible wires) are provided.

In addition, it is anticipated that other properties (e.g. dielectric, piezoelectric and electrochromic properties) of the oxide bronze compositions and articles of the present invention may be useful for fabrication of practical non-superconducting devices. For example, optical applications in which a textured article may provide an advantage include electrochromic devices. In addition, ferroelectric devices such as capacitors and piezoelectrics may be desirable to texture in accordance with the present invention. In one aspect of the invention, textured articles including the non-stoichiometric compound $Na_xWO_y$ and exhibiting various magnetic, electrical, and optical characteristics are provided. In these embodiments, it x may be $0.001<x<0.3$.

In contrast to cuprate (e.g., BSCCO and YBCO) superconductors, which are highly anisotropic, preferred oxide bronze compositions in accordance with the present invention will be either isotropic or only weakly anisotropic in their intragranular superconducting properties. More preferably, these oxide bronze superconducting compositions will be isotropic in nature, both in their intragranular properties and their grain morphologies.

However, in polycrystalline configurations of these oxide bronze superconductors which are the focus of this invention, a basic insight is that weak links can be anticipated at the grain boundaries. These weak links are obstacles to supercurrent flow, even in no applied magnetic field, and their ability to transport supercurrent is further degraded in the presence of magnetic field. In sufficiently low angle grain boundaries, arrays of dislocations form, allowing relatively undisturbed crystalline structures between the dislocations. Superconducting current can flow through these portions of the grain boundary. As the angle of the grain boundary increases, the density of dislocations along the grain boundary increases, and the undisturbed current path is choked off. This leads to the result that the maximum superconducting current of these grain boundaries, which limits the critical current density of the entire polycrystalline material, is large and independent of grain boundary angle in the low angle limit, but above a certain angle, it begins to fall off rapidly with increasing angle.

Typically the grain boundary angles in the oxide bronzes should be kept on average below 20 degrees and more preferably below 10 degrees, to ensure good superconducting transport. Between 10 and 20 degrees, the grain boundary is increasingly blocked by the misfit dislocation cores. The angle which marks the transition between good superconducting transport and degraded transport is called the critical angle. This novel insight about this new family of HTS materials leads to the recognition that to make practical conductors out of these materials, it will be necessary to texture them so that the grain boundary angles will be on average less than the critical angle. The average and collective orientation of the grains can be measured using standard x-ray diffraction rocking curve or pole figure techniques and the texture is characterized by a full-width-half-maximum (FWHM), which is preferably equal to or less than the critical angle. This means that the x-ray FWHM of oxide bronzes should be less than or equal to 20 degrees, and preferably less than or equal to 10 degrees. In contrast to the cuprate superconductors which are highly anisotropic and which in some cases (such as the BSCCO family) only require alignment along one axis (the c-axis), the oxide bronze superconductors requires should be aligned along all three major axes: a, b and c. However, the oxide bronzes have the advantage vis-a-vis YBCO, that many average texture directions, not just the cube texture [100], can be used because of their relatively low anisotropy.

In addition, for a given texture level, better current flow is expected in the oxide bronzes than in the cuprates because the greater bulk isotropy permits more intragranular current paths and the isotropic grain morphology permits more intergranular current paths. Accordingly, the expected relatively isotropic properties of the oxide bronze superconducting compositions, in combination with the high transition temperatures (e.g., greater than 77 K) can provide attractive practical materials suitable for use in the fabrication of superconducting devices, when they are appropriately textured.

This invention discloses methods and articles to address the weak link problem in large area applications where use of single crystals is impractical. Long length wires are one example of such an application. In the case of high temperature superconductors, this is to be accomplished by utilizing the tendency for formation of oxide bronze superconducting compositions at an interface or surface of a substrate such as a refractory metal oxide. One aspect of the invention is to have a highly textured substrate on which the oxide bronze superconducting composition can grow epitaxially. Preferably, such devices or applications will be configured to achieve high current densities and therefore exhibit high current-carrying capacity. In general, there is no restriction on grain size; both large (>10 micron) and small (<10 micron) grain sizes can be suitable for varying applications. The grain size can be primarily dictated by the grain size of the substrate and when based on roll-textured metals, is typically greater than 10 microns. The epitaxially grown oxide bronze superconductor generally adopts the grain size of the substrate. Fine powders can be mixed and reacted at elevated temperatures. With epitaxial growth, the tungsten bronze phase will nucleate at the substrate or buffered substrate surface. To enhance sintering and obtain a dense tungsten bronze layer, a higher temperature can be selected, and/or finer powders can be selected, and/or a composition-temperature regime can be selected where some liquid is formed that assists in the formation of epitaxial and/or dense tungsten bronze layers.

During synthesis, the superconducting phase is expected to grow epitaxially from the surface of a textured substrate. Taking advantage of this property, one can form textured articles according to the present invention using several processes. In one embodiment of the invention for example, superconducting articles with controlled texture can be formed on planar substrates which have the desired texture. This configuration may be particularly desirable for large area electronic applications. Exemplary applications in the electronics area include, but are not limited to, passive communications applications such as antennae, wave guides, filters and interconnects, and data processing or analog applications based on active devices such as Josephson junctions and superconducting field effect transistors.

In an alternative embodiment of the present invention, long length flexible substrates can be employed. These configurations may be particularly desirable for wire applications. In both embodiments, however, a clean textured deposition surface and epitaxial growth of the superconducting phase is desired in order to increase the efficiency of the current path in the resulting textured superconductor, in which the current is carried in certain planes or chains of atoms. An un-textured material can lead to weak links in the superconducting path, thereby leading to reduced critical currents and weaker superconducting performance in magnetic fields.

As mentioned above, one embodiment of the invention utilizes planar substrates as a basis to deposit films including the compositions of the present invention. In preferred embodiments, these films will be processed such that the articles formed thereby exhibit superconducting properties.

Referring now to FIG. 1, a coated conductor article 10 formed according to the present invention is shown. Article 10 includes a polycrystalline substrate 12 and a conducting oxide bronze layer 14 deposited thereon. Substrate 12 is a bi-axially textured substrate preferably with an average grain boundary misorientation less than 20°.

Substrate 12 can be formed of a variety of materials. Preferably, substrate 12 is non-magnetic. Exemplary substrate alloy materials include, but are not limited to, those shown in PCT International Publication Numbers WO 99/17307 and WO 99/16941, both of which are incorporated herein by reference. Additional substrate alloy materials include those alloys having a cube textured surface and include a first metal and a second metal that is different than the first metal. The alloys can include additional metals, or the alloys can include only the first and second metals (i.e. no more than trace amount of any other metals). Examples of metals from which the first and second metals can be selected include copper, nickel, chromium, vanadium, aluminum, silver, iron, palladium, molybdenum, gold and zinc. Generally, the alloys can include from about 5 atomic percent to about 45 atomic percent of the first metal (e.g., from about 10 atomic percent to about 40 atomic percent). Further, suitable substrates can include those alloys formed of three or more metals. In such an embodiment, the alloy can have the chemical formula $A_{100-x-y}B_xC_y$, where A is the first metal, B is a second metal, C is an oxide former, x is the atomic percent of B in the alloy, y is the atomic percent of C in the alloy, and (100-x-y) is the atomic percent of A in the alloy. A, B and C are each different metals. Y (i.e., the atomic percent of oxide former C in the alloy) is preferably at least about 0.5 (e.g., at least about 1 or at least about 2) and at most about 25 (e.g., at most about 10 or at most about 4). X (i.e., the atomic percent of the second metal B in the alloy) is preferably from about 0 to about 55 (e.g., from about 25 to about 55 or from about 35 to 55). Examples of metals from which the first and second metals can be selected include copper (Cu), nickel (Ni), chromium (Cr), vanadium (V), aluminum (Al), silver (Ag), iron (Fe), palladium (Pd), molybdenum (Mo), gold (Au) and Zinc (Zn). In some embodiments, the first metal is copper and the second metal is nickel. In these embodiments, the alloy may include from about 25 atomic percent nickel to about 55 atomic percent nickel (e.g., from about 35 atomic percent nickel to about 55 atomic percent nickel or from about 40 atomic percent nickel to about 55 atomic percent nickel. In these embodiments, the alloy can further include an oxide former, such as aluminum. In other embodiments, the first metal is nickel and the second metal is chromium. In these embodiments, the alloy can contain from about 5 atomic percent chromium to about 20 atomic percent chromium (e.g., from about 10 atomic percent chromium to about 18 atomic percent chromium or from about 10 atomic percent chromium to about 15 atomic percent chromium). In these embodiments, the alloy can further include an oxide former, such as aluminum. Examples of oxide formers include aluminum (Al), magnesium (Mg), titanium (Ti), zirconium (Zr), hafnium (Hf), yttrium (Y), chromium (Cr), gallium (Gs), germanium (Ge), beryllium (Be), lithium (Li), thorium (Th), silicon (Si), zinc (Zn), tin (Sn), boron (B) and the rare earth elements lanthanum (La), cerium (Ce), praseodymium (Pr), neodymium (Nd), Samarium (Sm), europium (Eu), gadolinium (Gd), terbium, (Tb), dysprosium (Dy), holmium (Ho), erbium (Er), thulium™, ytterbium (Yb), lutetium (Lu) and thorium (Th). In some cases, the oxide former is preferably selected from Al, Mg, Cr. Li, Ti, Hf, Zr, Ce, Yb or Sn, more preferably Al, Mg, Cr. Ce or Yb, and most preferably the oxide former is Al. The alloy preferably can have a biaxially textured surface (e.g., a (113)[211] surface), more preferably a cube textured surface (e.g., a (100[001] surface or a (100)[011] surface).

In some embodiments, the substrate alloy can be Ni—13%Cr or Cu—45%Ni—1.5%Al all percentages by weight. In particularly preferred embodiments, the substrate alloy can be Cu—49%Ni—1.5%Al, Ni—11.5%Cr—1.5%Al, or can include 0.05%Al.

Textured substrates (e.g., bi-axially textured) suitable for use in the invention can be formed using the methods disclosed in commonly owned and copending U.S. application Ser. No. 08/943,047, entitled "Substrates With Improved Oxidation Resistance," by C. Thieme, et al., and filed on Oct. 1, 1997; Ser. No. 08/942,038, entitled "Substrates For Superconductors," by L. Fritzemeier, et al., and filed on Oct. 1, 1997; Ser. No. 09/283,777, entitled "Alloy Materials," by C. Thieme, et al., and filed on Mar. 31, 1999; Ser. No. 09/283,775, entitled "Alloy Materials," by L. Fritzemeier, et al., and filed on Mar. 31, 1999; PCT Publication No. WO 99/17307, entitled "Substrates with Improved Oxidation Resistance," and published on Apr. 8, 1999; PCT Publication No. WO 99/16941, entitled "Substrates for Superconductors," and published on Apr. 8, 1999; as well as those methods disclosed in U.S. Pat. No. 5,741, 377 by Goyal et al. and U.S. Pat. No. 5,739,086 by Goyal et al.; all of which are incorporated herein by reference.

In some embodiments of making an HTS coated conductor, intermediate or transient layers may be used. Intermediate layers suitable for use in the present invention include those epitaxial metal or alloy layers that do not form surface oxides when exposed to conditions as established by $P_{O2}$ and temperature required for the initial growth of epitaxial films (for example, $P_{O2}$ and temperature conditions required for the growth of expitaxial buffer layers). In addition, the intermediate layer acts as a barrier to prevent substrate element(s) from migrating to the surface of the intermediate layer and forming oxides during the initial growth of the epitaxial layer. Absent such an intermediate layer, one or more elements in the substrate might be expected to form thermodynamically stable oxide(s) at the substrate surface which could significantly impede the depositon of epitaxial (for example, buffer) layers due to, for example, lack of texture in this oxide layer.

In some embodiments the intermediate layer is transient in nature. "Transient", as used herein, refers to an intermediate layer that is wholly or partly incorporated into or with the biaxially textured substrate alloy following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property (e.g. the intermediate layer is magnetic, such as Ni).

Exemplary intermediate metal layers include nickel, gold, silver, palladium and alloys thereof. Additional metals or alloys may include alloys of nickel and/or copper. Epitaxial films or layers deposited on an intermediate layer can include metal oxides, chalcogenides, halides and nitrides. These epitaxial layers could be a buffer layer, or layers, which serve as a template for the deposition of functional layers (e.g. superconductor, semiconductor, photovoltaic). Alternatively, the epitaxial layer could be a functional layer itself.

Care should be taken that the deposited intermediate layer is not completely incorporated into or does not completely diffuse into the substrate before the epitaxial (e.g. buffer) layer is deposited to allow for epitaxial nucleation and growth of the initial buffer layer structure. This means that after selecting the metal (or alloy) for proper attributes such as diffusion constant in the substrate alloy, thermodynamic stability against oxidation under practical epitaxial (e.g. buffer) layer growth conditions and lattice matching with the epitaxial (e.g. buffer) layer, the thickness of the deposited metal (or alloy) layer has to be adapted to the epitaxial (e.g.

buffer) layer depositon conditions, in particular to temperature. For example, if a CuNiX alloy is used as a substrate alloy (X is an oxide former such as Cr, Al, Mg or the like), Ni as an intermediary metal layer, and 600° C. as an epitaxial buffer layer deposition temperature, the deposited Ni layer needs to be thicker than 0.2 micrometer, preferably 0.5 to 1 micrometer. This is to ensure that the entire intermediate layer is not absorbed by or incorporated with the substrate alloy before the initial epitaxial buffer layer covers the entire surface of the intermediate layer and to ensure that the substrate alloy oxide scale forming element(s) does not reach the deposition surface before the initial epitaxial layer covers the entire surface of the intermediate layer. If CuNi is used as a substrate alloy the Ni needs to be thicker than one micrometer, preferably 2–5 micrometer, as the Ni will also act as an oxygen barrier to avoid oxidation of the CuNi alloy. More generally, conventional diffusivity calculations can be used to determine the time necessary for diffusion of substrate alloy elements to the surface of the intermediate layer, and/or for the intermediate layer to be incorporated into the substrate alloy under the specific temperatures used for epitaxial layer deposition.

Deposition of the intermediate metal layer can be done in a vacuum process such as evaporation or sputtering as in the present invention, or by electro-chemical means such as electroplating (with or without electrodes). These deposited intermediate metal layers may or may not be epitaxial after deposition (depending on the substrate temperature during deposition), but epitaxial orientation can subsequently be obtained during a post-deposition heat treatment. For example 600° C. heat treatment for 1–2 hours has been found to be sufficient to induce texture in evaporated, sputtered and electroplated Ni layers on the cube textured Cu—46% Ni substrates.

In one embodiment, a metal or metal alloy (for example, copper, copper alloy (e.g., CuNiAl), nickel, nickel alloy (e.g., NiCr)) is deformed into a wire configuration, either a tape or a round wire, and subjected to heat treatment as described in one of the above-mentioned patents or patent applications to produce a bi-axially textured substrate. In preferred embodiments, the substrate is subjected to a combined deformation and heat treatment such that a consistent texture is produced along the length of the wire. A specific cube texture is not required in this case (in contrast to the case of substrates for some cuprate superconductors for which the cube texture is preferred). This is a significant advantage of the oxide bronze superconductors, because many other kinds of texture can be attained by appropriate deformation and heat treatments. This advantage stems from the relatively isotropic structure of these new superconductors. This can be particularly advantageous in some metals. For example, texture in copper and some of its alloys can be very sharp, i.e., the grain boundary angles are very low in such a substrate. Preferably, a substrate metal or alloy is chosen whose lattice parameter matches or significantly matches the lattice parameter or one of the interatomic spacings of the oxide bronze composition. A lattice constant of the oxide bronze that does not deviate significantly from that of the substrate promotes epitaxial growth of the $A_xBO_y$ on a bi-axially textured surface. For example, the tetragonal lattice of $Na_xWO_3$ has a lattice constant in the a- and b-directions of 3.82A, or 6% larger than that of Cu. This means that the a-b plane of this lattice fits quite well on that of a textured copper surface, whether this is a bi-axially textured substrate or a bi-axially textured Cu matrix, in case a powder-in-tube process is used. This lattice match is very similar to that of YBCO on buffered Ni substrates, a combination that is common in HTS YBCO coated conductors.

Various methods can be used to deposit layer 14 on substrate 12, preferably such that the deposition results in a layer 14 which is crystallographically aligned or epitaxial, so as to eliminate or substantially eliminate weak links in the current path. As discussed above, the use of the oxide bronze compositions in the present invention may be advantageous for the formation of superconducting articles relative to cuprate superconductors.

In one embodiment, the deposition of oxide ceramic layer(s) 14 on textured substrate 12 is performed under conditions that favor epitaxy. Methods for growing grains epitaxially, particularly in buffer layers, in accordance with the invention are disclosed in commonly owned U.S. Pat. No. 6,027,564, issued Feb. 22, 2000, entitled "Low Vacuum Vapor Process For Producing Epitaxial Layers," by L. Fritzemeier, et al.; PCT Publication No. WO 99/15718, published on Apr. 1, 1999, entitled "Low Vacuum Vapor Process for Producing Epitaxial Layers"; PCT Publication No. WO 99/15719, published on Apr. 1, 1999, entitled "Low Vacuum Vapor Process for Producing Superconductor Articles with Epitaxial Layers"; U.S. Pat. No. 6,022,832, entitled "Low Vacuum Vapor Process For Producing Superconductor Articles With Epitaxial Layers," by L. Fritzemeier, et al.; Ser. No. 09/007,372, entitled "Low Vacuum Vapor Process For Producing Epitaxial Layers Of Semiconductor Material," by L. Fritzemeier, et al, and filed on Jan. 15, 1998; Ser. No. 09/007,373, entitled "Superconductor Articles With Epitaxial Layers," by L. Fritzemeier, et al., and filed on Jan. 15, 1998; Ser. No. 60/166,145, entitled "Methods and Compositions for Making a Multi-Layer Article," by W. Zhang et al., and filed Nov. 18, 1999; and PCT Publication No. WO 99/15333, published on Apr. 1, 1999, entitled "Superconductor Articles with Epitaxial Layers," all of which are incorporated herein by reference.

Additional reference is made to the following in connection with the preparation of coated conductors: U.S. application Ser. No. 60/166,140, filed Nov. 18, 1999, entitled "Multi-Layer Articles and Methods of Making Same"; U.S. application Ser. No. 60/166,297, filed Nov. 18, 1999, entitled "Superconductor Articles and Compositions and Methods for Making Same"; U.S. Pat. No. 5,231,074; and PCT Publication No. WO 98/58415, published on Dec. 23, 1998; all of which are incorporated herein by reference, and other methods of material deposition known to those of skill in the art.

This may allow formation of oxide layers with low angle grain boundaries. When the oxide layer 14 is superconducting, the arrangement may be most optimal for high critical current densities.

As previously discussed, the present invention provides for the production of epitaxial $A_xBO_y$ layers on textured surfaces in order to improve the current path in a conductor, thereby eliminating weak links in the current path. In preferred embodiments, the $A_xBO_y$ layer is a superconducting layer.

Materials such as the oxide bronzes, $A_xBO_y$, can be prepared by a variety of methods. For example, a general technique for the preparation of an oxide bronze phase with the general composition $Na_xWO_3$ includes heating the normal sodium tungstate with tungsten metal. The electrical, magnetic, optical and structural properties of these materials depend mainly on the identity of A and B and the value of x. In the $A_xWO_3$ materials, the structure includes a deficient perovskite lattice in which the structure consists of corner shared $WO_6$ octahedra as in $WO_3$. In contrast, the molybdenum bronzes include a mixture of edge and corner sharing. The prevalence of edge sharing also increases in the vanadium and titanium bronzes.

For purposes of illustration, the following discussion will utilize tungsten bronze having the formula $Na_xWO_3$. This is intended to be exemplary. It will be appreciated that other compositions as set forth above are within the scope of the invention. $Na_xWO_3$ films can be prepared by depositing an alkoxide (or other metal organic based precursor) based precursor (with the desired composition and stoichiometry) film onto an appropriately textured substrate 12. For example, the solution can include a mixture of $W(OR)_4$ and NaOR in the target composition, where OR is an alkoxide group (for example, 2-methoxyethoxide, —O—$C_2H_4$—O—$CH_3$). These materials will be converted to the desired $Na_xWO_3$ phase by processing at the appropriate temperature and atmosphere, i.e., to form the superconducting phase in a textured state.

As a general procedure, oxide bronze precursor materials are heated to at least about 900° C., preferably at least about 1200° C., and more preferably at least about 1300° C., for example, 1350° C. This temperature is held for at least about 10 hours, preferably at least about 20 hours, and more preferably at least about 25 hours, for example 30 hours. The material is then cooled by about 50° C. to about 150° C., for example to about 850 to about 1330° C., at a cooling rate of about 0.5° C. per hour to about 10° C. per hour, for example from 1° C. per hour to about 5° C. per hour). In one embodiment, the material is cooled to about 1200° C. at about 2° C. per hour. Thereafter, the material is cooled to about room temperature at a rate of from about 30° C. per hour to about 120° C. per hour, for example 50° C. per hour to about 100° C. per hour.

In alternative embodiments, precursors including metal nitrates, acetates, trifluoroacetates, or carbonates can be used in place of the metal alkoxides. In still another embodiment, the $Na_xWO_3$ precursors can be deposited on substrate 12, as a mixture of $WO_2+WO_3+Na_2WO_4$. As an example of reaction mixtures useful to obtain materials of formula $Na_{0.0Q}WO_3$ (where Q is the desired sodium percentage in the material), a mixture of the following composition is reacted $0.005 \times Q$ $WO_2/(1-0.0Q)WO3/0.005 \times Q$ $Na_2WO_4$ will yield a composition of $Na_{0.0Q}WO_3$. For example, molar ratios of 0.025 $WO_2$/0.95 $WO_3$/0.025 $Na_2WO_4$ can be reacted to yield $Na_{0.05}WO_3$ on the surface of the finished composition. When heated in vacuum, $WO_2+WO_3+Na_2WO_4$ will form $Na_xWO_3$. It will be appreciated that x can be varied, but can be selected to be between 0.001 and 0.3 (atomic ratios) to form a superconducting film. An advantage of the powder and solution techniques described above is low cost.

The reaction to form $A_xBO_3$ from any of the above-mentioned precursors is carried out in vacuum or a reducing environment toward the substrate at temperatures sufficiently high to prevent or reduce any oxides that might form on the substrate (e.g., copper oxide). Substrate (e.g., copper) 12 thus remains unaffected. Using copper as an example, temperatures greater than 1000° C. (e.g., between 1030–1060° C. and more specifically 1035° C.) and vacuum greater than $10^{-6}$ Torr can be used. When nucleated at the surface, the mixture will form an epitaxial layer of the $Na_xWO_3$ phase reflecting the orientation of the substrate and therefore having low grain boundary angles. In the case of a superconducting layer, this can result in minimal or no weak links between grain boundaries.

In addition, films of $Na_xWO_3$ can be deposited by vacuum techniques. These vacuum-based deposition techniques may be higher cost but may promote epitaxy more easily. Exemplary vacuum techniques include sputtering, PLD, thermal evaporation, metal organic chemical vapor deposition, or e-beam processes onto appropriately textured substrates (discussed above). The material may form in situ with the crystallographic texture of the underlying substrate. Alternatively, depending on the temperature used for the deposition, it may be necessary to post process the films at higher temperatures to form the correct phase and texture.

Alternatively, films of $WO_3$ can be deposited by either a vacuum or solution technique onto an appropriate textured substrate (discussed above). These films can then be doped with the appropriate levels of the Na to form the desired $Na_xWO_3$ phase by a variety of techniques. For example, the $WO_3$ films can be reacted with a Na compound such as n-butyl sodium. The level of doping is established by the electrochemical potential between the Na ion in solution and in the NaxWO3. This is essentially an oxidation/reduction process. Electropotential equilibrium can be established by allowing the electrochemical potential of sodium in the film to reach the electrochemical potential of sodium in the sodium compound (e.g., n-butyl sodium).

Alternatively, Na can also be doped into the film by sputtering from an appropriate (e.g. $Na_2CO_3$) target and then annealing. In yet another alternative for doping the film, the $WO_3$ film can be reacted with Na vapor to obtain the desired composition or Na can be ion implanted.

The Na-doped $WO_3$ films can then be reacted at the appropriate temperature (as described above as a general procedure) to form the desired $Na_xWO_3$. Preferably, the $Na_xWO_3$ phase will nucleate in the textured substrate and inherit the crystallographic texture of the substrate.

In another embodiment, the composition can be deposited on the substrate as follows. Alternating layers of $Na_2WO_3$ and W can be deposited (by either solution or vapor phase processes) on an appropriately textured substrate (discussed above) and reacted at the appropriate temperature (again, as described above in a general procedure) to form the desired phase. Similarly, alternating layers of $Na_2WO_3$ and $WO_3$ can be deposited in ratios sufficient to give the desired stoichiometry. The desired phase can be obtained by reacting the materials in the presence of $H_2$ (or other appropriate reducing environment) at the appropriate temperature.

The synthetic techniques described above allow precise control of the composition and stoichiometry of the films while simultaneously promoting the growth of the desired phase in a precisely controlled crystallographic orientation that minimizes weak-links between grains.

Although these techniques describe the formation of $Na_xWO_3$ films, these techniques are also applicable to other oxide bronze film compositions of the present invention that include specific crystallographic orientation in order to exploit specific electrical, dielectric or optical properties.

Figure 2:
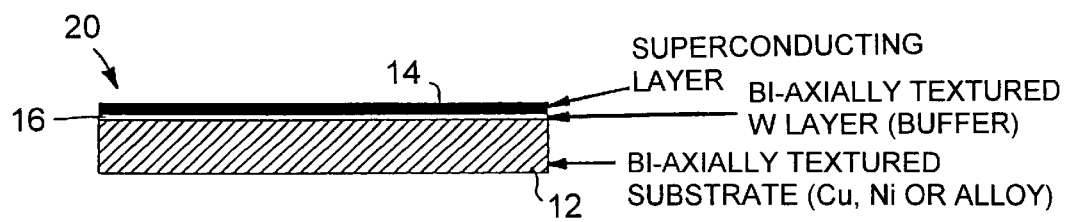
FIG. 2 is an illustration of an alternative embodiment of the article shown in FIG. 1.

Referring now to FIG. 2, an alternative embodiment of the coated conductor type article of FIG. 1 is shown. In this embodiment, article 20 includes a buffer layer 16 deposited on substrate 12. In some embodiments, substrate 12 (e.g., copper or copper alloy substrate) can be coated epitaxially with the B compound (e.g., W) in the $A_xBO_3$ compound using sputtering for example to create a buffer layer between the substrate (e.g., Cu) and oxide layer 14.

In some cases, the buffer layer can be used to reduce the thermal expansion of the substrate. For example, tungsten can be used to reduce the thermal expansion of Cu, Cu alloy, Ni or Ni alloy substrates. Adjustment of the coefficient of the thermal expansion (CTE) can be accomplished by selecting the proper substrate/buffer layer (e.g., Cu/W, Ni/W or the Cu- and or Ni-alloy/W) ratios. The Cu+W combination may be desirable as the two metals do not mix in any appreciable amounts, either by solid solutions or as intermetallics, and can be used up to 1080° C. The buffer layer can also function as a barrier layer to prevent chemical reaction between the $A_xBO_y$ layer and the substrate. Other epitaxial metal or oxide layers can be considered as well for the buffer layer function. See the copper-tungsten phase diagram disclosed in T. B. Massalski, *Binary Alloy Phase Diagrams*, 2d Ed., Vol. 2, p. 1504 (published and copyright 1990), incorporated herein by reference. In other embodiments, Ta and Nb may be equally effective, with similar diagrams up to 1085° C. See T. B. Massalski, *Binary Alloy Phase Diagrams*, 2d Ed., Vol. 2, pp. 1486 and 1441 (published and copyright 1990), incorporated a herein by reference.

Figure 3:
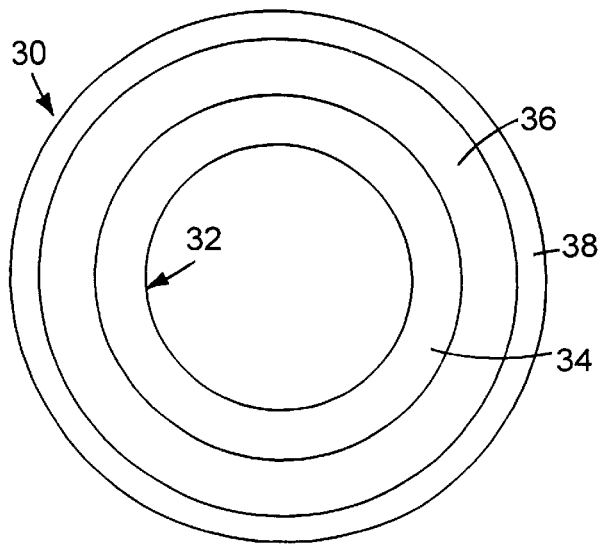
FIG. 3 is a depiction of a monofilament article according to another alternative embodiment of the present invention.
Figure 4:
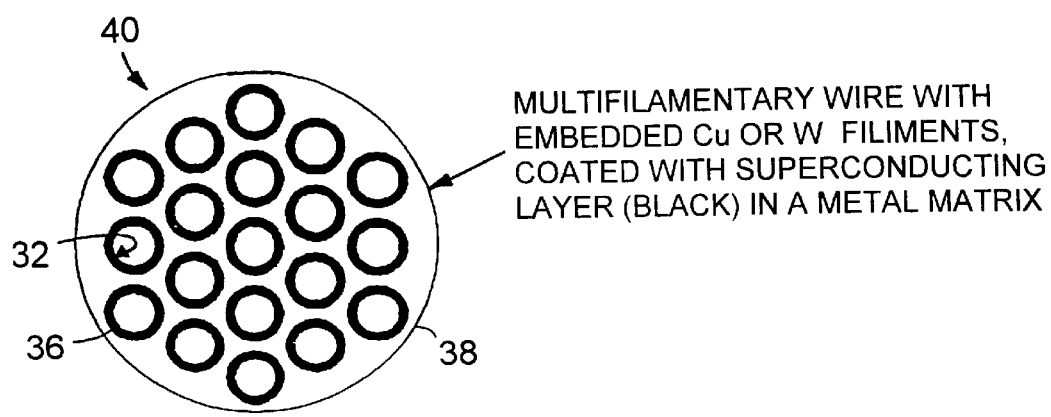
FIG. 4 is an illustration of a multifilamentary wire suitable for use in accordance with the present invention.

In another alternative embodiment of the invention, a thin, round wire can be employed as a substrate material when the superconducting path is linear or three-dimensional rather than planar. Referring now to FIGS. 3 and 4, a monofilament wire 30 and a multifilamentary wire 40 are respectively illustrated. As shown in FIG. 3, monofilament wire 30 includes a core filament or wire. Wire 32 can be formed of any of the materials discussed above with reference to substrate 12. For example, wire 32 can be formed of copper, copper alloy, nickel, nickel alloy or the like. In the embodiments shown in FIGS. 3 and 4, the round wire has a strong fiber texture, such as the (110) fiber texture in drawn W wire (and many other body centered cubic (bcc) metal and metal alloy wires), or (100) texture in Cu wire and oxide dispersion strengthened Cu wire or Cu alloy wire. Wire can be formed in accordance with the methods disclosed in commonly owned and copending U.S. application Ser. No. 08/731,302, entitled "Improved Performance For Oxide Dispersion Strengthened Superconductor Composites," by L. Masur, et al., and filed on Oct. 15, 1996; Ser. No. 08/943,047, entitled "Substrates With Improved Oxidation Resistance," by C. Thieme, et al., and filed on Oct. 1, 1997; Ser. No. 09/283,777, entitled "Alloy Materials," by C. Thieme, et al., and filed on Mar. 31, 1999; and Ser. No. 09/500,701, entitled "Oxide Layer Method," by Buczek et al., and filed on Feb. 9, 2000; all of which are incorporated herein by reference. As discussed above in connection with FIG. 2, wire 30 (e.g., Cu) can be coated epitaxially with an additional layer 34 to provide a buffer layer. Buffer layer 34 can be formed of any material that will allow layer 36 to be deposited (preferably, in a textured manner) on buffer layer 34. It will be appreciated that buffer layer 34 is optional and may not be necessary in some embodiments of the invention.

As further shown in FIG. 3, conducting layer 36 is deposited on the filament 32 (or on layer 34 when a buffer layer is included). Conducting layer 36 is formed of a material having the general formula $A_xBO_y$, as discussed hereinabove. Preferably, layer 36 is a superconducting layer. Monofilament 30 further includes a metal matrix 38 surrounding conducting layer 36 and wire 32 (and optionally, buffer layer 34). Metal matrix 38 provides mechanical support for monofilament 30 and is preferably formed of a noble metal. Noble metal or noble alloy, as used herein, refers to metal or alloy in which no reaction or substantially no reaction occurs between the oxide and substrate. Depending on the oxide bronze composition, process conditions and the like, exemplary noble metals may include, but are not limited to, Ag, Cu and their alloys.

Conducting layer 36 can be deposited on wire 32 or buffer layer 34 using any of the techniques described above in connection with FIGS. 1 or 2. In one embodiment for example, the thin textured wire 32 is drawn through a $BO_2+BO_3+A_2BO_4$ slurry or solution, and heat treated to form the superconducting compound in a manner that aligns the superconducting path with the axis of wire 32. A metal layer is then formed on the wire, for example, by drawing through a molten metal bath, followed by solidification. The metal layer can also be formed by evaporating or electroplating the metal layer onto the wire. Suitable metals include for example, copper, indium, bismuth, lead, tin, zinc, aluminum and their alloys or alloys with a low melting temperature.

An expected advantage of the oxide bronze textured layer which forms on the fiber-textured substrate is that because of its relatively isotropic bulk properties, the full circumference contributes to the current capacity, in contrast to the highly anisotropic cuprate superconductors. Monofilament 30 can be combined with other monofilament wires by bundling for example to form a multifilament wire 40 (see FIG. 4). The combination of monofilament wires 30 can be done before or after the metal matrix has been formed around the conducting layer. The wires are also relatively isotropic as a function of the direction of applied magnetic field.

A multifilamentary wire in which the superconducting filaments are embedded in a metal matrix 38 is illustrated in FIG. 4. This wire may be particularly desirable for AC applications as the wire can be twisted to reduce AC losses, while the matrix electrical resistivity can be adjusted (e.g., through alloying) to reduce the losses further. See e.g., commonly owned and copending U.S. application Ser. No. 09/240,998, entitled "Superconducting Composite With High Sheath Resistivity," by A. Otto, et al., and filed Feb. 1, 1999; Ser. No. 09/274,438, entitled "Current Limiting Composite Material," by A. Otto, et al., and filed Mar. 22, 1999; and Ser. No. 09/500,718, entitled "Coated Conductors with Reduced A. C. Loss," by Malozemoff et al., and filed Feb. 9, 2000; each of which are incorporated herein by reference. Again, the relative isotropy of the oxide bronzes is expected to be a significant advantage in making twisted AC wire.

Figure 5:
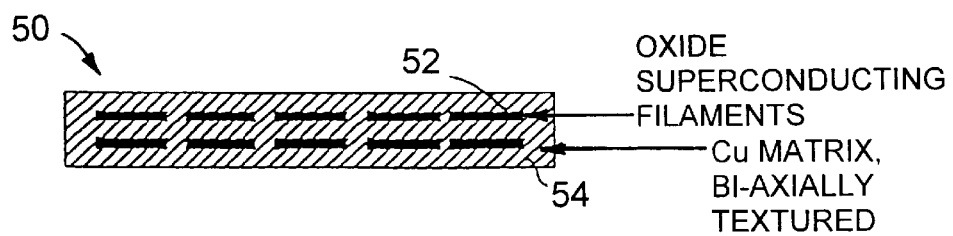
FIG. 5 is an illustration of yet another alternative configuration of an article suitable for use in accordance with the present invention.

In an alternative embodiment, articles according to the present invention can be provided in a metal matrix composite using an oxide powder-in-tube (OPIT) or metallic precursor approach. Such an embodiment is shown in FIG. 5. More specifically, article 50 includes at least one and preferably a plurality of oxide filaments 52. Filaments 52 are formed of a material having the general formula $A_xBO_y$, as discussed hereinabove. Preferably, filaments 52 are superconducting. Filaments 52 are surrounded by a noble metal or alloy matrix (e.g., Cu or Ag) 54, as discussed above. Matrix 54 is bi-axially textured. The embodiment illustrated in FIG. 5 may be particularly desirable for growing layers suitable for use with wire applications.

In one embodiment, $BO_2+BO_3+A_2BO_4$ powders can be poured into a tube or billet formed of metal (e.g., formed of Cu, Cu-alloy, Pt, Pt-alloy, Ni, Ni alloy, Ag or Ag alloy) tube or billet, and drawn or extruded to a wire suitable for bundling. Similar oxide powder-in-tube (OPIT) processes are known for Bi-2223 superconducting wire production.

The bundled wire is drawn to the desired size and reacted at high temperatures and in vacuum or forming gas, in order to maintain the integrity of the matrix material 54 (e.g., Cu). Oxygen can diffuse through the matrix at elevated temperatures, and the high temperature/vacuum combination will prevent the formation of metal oxides (e.g., Cu). Alternatively, the bundled wire can be rolled, and when rolled to a sufficiently high total reduction, form a bi-axially textured or even cube textured matrix (e.g., Cu). The nucleation of the $A_xBO_y$ compound on these internal surfaces (e.g., Cu) results in the textured formation of the desired superconducting $A_xBO_y$ phase. This allows a very efficient use of the matrix (e.g., Cu), and provides a well-protected oxide bronze superconducting compound inside the matrix (e.g., Cu).

Oxide bronze textured layers can be fabricated in two parts, each on their own textured substrates, and then the two layers can be bonded together in a face-to-face configuration, such as described in FIGS. 6A and 6B. Referring to FIG. 6A, an alternative embodiment of the invention is illustrated. In this embodiment, conductor 60' includes substrate layers 62a and 62b, high temperature superconducting oxide bronze layers 66a and 66b, cap layers 68a and 68b, and optionally includes buffer layers 64a and 64b. FIG. 6B is an expanded view of the offset region of FIG. 6A. FIG. 6B includes conductors 61a and 61b which are offset (i.e., not registered at their respective edges as shown). The offset configuration shown in this embodiment may be preferable in some circumstances because it allows for direct current transfer into the superconducting filament of layers 66a and 66b, for example, at splices and terminations, from the broad surface of the cap layers 68a and 68b, respectively, as compared to transfer from the edges of the superconducting layers 66a and 66b. The two conductors 61a and 61b can be coupled through their partially conductive intervening cap layers so that the effective conductor thickness includes the thickness of the intervening (cap) layer(s) 68a and 68b. To minimize losses in this configuration with a parallel a.c. field, it is necessary to keep the thickness of the cap layer(s) as small as possible, for example less than 10 microns, or in any case less than the critical hysteretic dimension for this orientation of the field. The advantages of this configuration in the parallel a.c. field orientation have been described in U.S. Provisional Application, Serial No. 60/145,468, Filed Jul. 23, 1999, entitled "Enhanced High Temperature Superconductors," incorporated herein by reference.

Alternative embodiments are particularly favorable for making a very fine ground structure which may or may not be textured. Preferably, the grains have on average a dimension of less than 10 microns in at least one direction. Articles according to the present invention can be formed using a metallic precursor approach. In this embodiment, conducting oxides (e.g., superconducting oxides) containing refractory metal cations, for example, tungsten, molybdenum, or niobium as well as small amounts of Group 1A cations, for example, lithium, sodium or potassium, are intended for manufacture in wire form, starting with at least some metallic constituents. The mono- or multi-filament conductor in this embodiment can be made as follows. Fine wires of the refractory metal are made either in alloyed/mixed (for example by high energy milling) form with Group 1A metal precursors or their oxides, or the wires may be pure elements. The wires may be in any desired shape, for example square, hexagonal, or round. If the wires are pre-alloyed, then they may be coated with an oxygen source, for example copper or silver oxide or a peroxide (e.g. potassium peroxide), where the cation of that oxide is reduced thermodynamically by the refractory metal to form a metal (or peroxide) that is not reactive with either the refractory metal or Group 1A metal, or their oxides. The wires are then bundled. This can be accomplished for example by cabling, twisting, or braiding to form the multi-filament architecture. The wire is then heated to the superconducting phase forming temperature, resulting in oxidation of the reactive refractory and reduction of the oxygen source, and ultimately forming the desired superconducting oxide filaments.

In a related approach, the refractory metal precursor is coated with the Group 1A element to attain the desired precursor composition. This can be accomplished for example by evaporation, electrolytic reduction, direct galvanic reduction by the refractory metal or liquid metal infiltration. The wires may then be bundled together, with possibly some or a substantial amount of further deformation. The bundle may also be sheathed in a suitable metal immediately after fabrication, or after subsequent deformation.

The metal precursor(s) in the bundle is (are) ultimately oxidized to form the required cations, and reacted to form the superconducting oxide phase.

It is particularly desirable to introduce the oxygen source in the core of the refractory metal form. For this, the refractory is in the form of a tube, or a bundle of wires around the oxygen source core. During oxidation, of the precursor, the cores are reduced to form a metal that provides the composite with mechanical integrity and parallel conduction/current sharing paths.

Oxidation of the metallic constituents of the precursor may occur either by an exchange reaction with a nearby oxygen source compound as described above, or by exposing the precursor to a suitably oxidizing environment such as oxygen gas at elevated temperature, or an electrochemical cell.

In yet another approach, the metal precursor wires are oxidized and reacted, followed by formation of the metal matrix by for example liquid metal impregnation, electroplating, evaporation with reflow or sintering employed to bond together all the filaments.

Because of the relatively isotropic nature of oxide bronze superconductors, there are few restrictions on the orientation of the textured substrate, which can be optimized for other properties such as mechanical properties or smoothness. This same property allows oxide bronze superconductors to be grown on nonplanar configurations, over steps and in other complex configurations, still maintaining good current carrying characteristics as long as the oriented structure is maintained. Weak links can also be introduced on purpose, by creating substrates with different orientations in different regions by a variety of means well known in the art and then growing the epitaxial doped refractory metal oxide superconductors on top. These weak links can serve as Josephson junctions in active electronic devices.

Current density in the textured oxide bronze structures of this invention can also be increased by the introduction of pinning centers in the grains. Chemical inclusions with dimensions of the coherence length (of order 10–100 angstroms) are preferred, but damage tracks from irradiation with neutron, proton, heavy ion or fission fragments from ions such as uranium can also be used.

In addition to the superconducting applications discussed above, all these synthetic techniques can be applied to the oxide bronzes for other applications such as dielectric, piezoelectric, optical and electrochromic applications.

It should be appreciated by those skilled in the art that the specific embodiments disclosed above may readily be utilized as a basis for modifying or designing other methods or structures for carrying out the same purpose of the present invention. It should also be realized by those skilled in the art that such equivalent constructions do not depart from the spirit and scope of the invention as set forth in the appended claims.

What is claimed is:

1. A textured oxide bronze film, comprising:
   a substrate or matrix; and
   a textured, polycrystalline layer or filament disposed on top of or embedded in the substrate or matrix, the layer or filament formed of an oxide bronze material having the formula $A_xBO_y$, in which A comprises an alkali, alkaline earth or rare earth metal and in which A has a valence, m, equal to 1, 2 or 3, B comprises a transition metal having a valence, n, less than or equal to 6, $0<x<1$ on an atomic ratio basis and $y=[(x)(m)+n]/2$,
   wherein the textured layer is characterized by a full-width-half-maximum (FWHM) of less than or equal to 20 degrees.

2. A high temperature superconductor article, comprising:
   a substrate or matrix; and
   a polycrystalline superconducting layer or filament disposed on top of or embedded in the substrate or matrix, the superconducting layer or filament having a transition temperature of at least 50 K and formed of an oxide bronze material having the formula $A_xBO_y$, in which A comprises an alkali, alkaline earth or rare earth metal and in which A has a valence, m, equal to 1, 2 or 3, B comprises a transition metal having a valence, n, less than or equal to 6, $0<x<1$ on an atomic ratio basis and $y=[(x)(m)+n]/2$,
   wherein the superconducting material is extended along a length of the article to allow for conduction of supercurrent along the length of the article.

3. The superconductor article of claim 2, wherein the polycrystalline superconducting layer is a thin continuous sheet disposed on the substrate.

4. The superconductor article of claim 2, wherein the polycrystalline superconducting layer or filament is embedded in a matrix and comprises small, fine grains in at least one direction.

5. The superconductor article of claim 4, wherein the average grain size in at least one direction is less than ten micrometers.

6. The superconductor article of claim 5, wherein the average grain size in at least one direction is less than one micrometer.

7. The superconductor article of claim 2, wherein the polycrystalline superconducting layer or filament comprises small, fine grains in two orthogonal directions.

8. The superconductor article of claim 7, wherein the average grain size in at least two directions is less than ten micrometer.

9. The superconductor article of claim 8, wherein the average grain size in at least two directions is less than one micrometer.

10. The superconductor article of claim 2, wherein the polycrystalline superconducting layer or filament comprises small, fine grains in all three orthogonal directions.

11. The superconductor article of claim 10, wherein the average grain size is less than ten micrometer.

12. The superconductor article of claim 11, wherein the average grain size is less than one micrometer.

13. The superconductor article of claim 2 wherein the article is textured.

14. The superconductor article of claim 13, wherein the textured superconducting layer is characterized by a fall-width-half-maximum (FWHM) of less than or equal to 20 degrees.

15. The superconductor article of claim 14, wherein $0.001<x<0.3$.

16. The superconductor article of claim 15, wherein A comprises a material selected from the group consisting of Li, Na, K, Cs and Rb.

17. The superconductor article of claim 15, wherein A comprises a material selected from the group consisting of a rare earth metal, Mg, Ca, Sr, Ba, Sn, In, Cu, Ag, Tl and Pb.

18. The superconductor article of claim 15, wherein B comprises a material selected from the group consisting of W, Mo, Ti, V, Nb, Ta, Re and Ru.

19. The superconductor article of claim 15, wherein y is greater than 2.8 and less than or equal to 3.05.

20. The superconductor article of claim 19, wherein A comprises a material selected from the group consisting of Li, Na, K, Cs and Rb.

21. The superconductor article of claim 19, wherein A comprises a material selected from the group consisting of a rare earth metal, Mg, Ca, Sr, Ba, Sn, In, Cu, Ag, Tl and Pb.

22. The superconductor article of claim 19, wherein B comprises a material selected from the group consisting of W, Mo, Ti, V, Nb, Ta, Re and Ru.

23. The superconductor article of claim 22, wherein B is W and A comprises Na.

24. The superconductor article of claim 23, wherein the superconductor has a transition temperature of at least 77 K.

25. The superconductor article of claim 24, wherein the article is in the form of a wire.

26. The superconductor article of claim 24, wherein the article is in the form of a tape.

27. The superconductor article of claim 24, wherein the article is in the form of a cable.

28. The superconductor article of claim 24, wherein the superconducting layer is formed of $Na_{0.05}WO_3$.

29. The superconductor article of claim 28, wherein the article is in the form of a wire.

30. The superconductor article of claim 28, wherein the article is in the form of a tape.

31. The superconductor article of claim 28, wherein the article is in the form of a cable.

32. The superconductor article of claim 2, wherein the article is in the form of a wire.

33. The superconductor article of claim 32, wherein the wire is wound into a coil or magnet.

34. The superconductor article of claim 2, wherein the article is in the form of a tape.

35. The superconductor article of claim 2, wherein the article is in the form of a cable.

36. A power transmission cable, comprising:
   a plurality of helically wound high temperature superconductor articles, the high temperature superconducting articles each comprising:
   a substrate; and
   a polycrystalline superconducting layer deposited on the substrate, the superconducting layer having a transition temperature of at least 50 K and formed of a material having the formula $A_xBO_y$, in which A comprises an alkali, alkaline earth or rare earth metal and in which A has a valence, m, equal to 1, 2 or 3, B comprises a transition metal having a valence, n, less than or equal to 6, $0<x<1$ on an atomic ratio basis and $y=[(x)(m)+n]/2$, wherein the superconducting layer is deposited on the substrate such that grains in the superconducting layer are crystallographically textured.

37. A textured superconductor article, comprising:

a substrate; and a substrate or matrix; and a textured, polycrystalline superconducting layer or filament disposed on top of or embedded in the substrate or matrix, the superconducting layer or filament having a transition temperature of at least 50 K and formed of an oxide bronze material having the formula $A_xBO_y$, in which A comprises an alkali, alkaline earth or rare earth metal and in which A has a valence, m, equal to 1, 2 or 3, B comprises a transition metal having a valence, n, less than or equal to 6, $0<x<1$ on an atomic ratio basis and $y=[(x)(m)+n]/2$, wherein the textured superconducting layer is characterized by a full-width-half-maximum (FWHM) of less than or equal to 20 degrees.

* * * * *

UNITED STATES PATENT AND TRADEMARK OFFICE
CERTIFICATE OF CORRECTION

PATENT NO.   : 6,436,317 B1
DATED        : August 20, 2002
INVENTOR(S)  : Alexis P. Malozemoff et al.

It is certified that error appears in the above-identified patent and that said Letters Patent is hereby corrected as shown below:

<u>Title page,</u>
Item [56], References Cited, OTHER PUBLICATIONS, replace "vol. 13, Nos. 8 & 10 (1999) pp 997-1004." with -- vol. 13, Nos. 9 & 10 (1999) pp 997-1004 --

Signed and Sealed this

Sixteenth Day of December, 2003

JAMES E. ROGAN
*Director of the United States Patent and Trademark Office*